United States Patent [19]
Brunner

[11] Patent Number: 6,046,640
[45] Date of Patent: Apr. 4, 2000

[54] SWITCHED-GAIN CASCODE AMPLIFIER USING LOADING NETWORK FOR GAIN CONTROL

[75] Inventor: Eberhard Brunner, Waakirchen, Germany

[73] Assignee: Analog Devices, Inc., Norwood, Mass.

[21] Appl. No.: 08/965,721

[22] Filed: Nov. 7, 1997

[51] Int. Cl.[7] ........................................ H03F 1/22
[52] U.S. Cl. ............................ 330/254; 330/311
[58] Field of Search ................ 330/66, 254, 292, 330/307, 311; 327/359

[56] References Cited

U.S. PATENT DOCUMENTS

| 4,380,739 | 4/1983 | Velo ........................................ 330/254 |
| 5,751,190 | 5/1998 | Nguyen et al. ...................... 330/254 X |

OTHER PUBLICATIONS

Hayward, Wes; *Introduction to Radio Frequency Design*, pp. 249–252 (1994).

Fenk, Josef; "RF–Heterodyn Receiver Design Technique for Wireless Systems"; *Electronics Laboratories Advanced Engineering Course on RF IC Design for Wireless Communication Systems*, Lausanne, Switzerland, Jul. 3–7, 1995 pp. 1, 2 and 28.

Meyer, Robert G.; "A 1–Ghz BiCMOS RF Front–End IC"; *IEEE Journal of Solid State Circuits*; vol. 29, No. 350–355 (Mar. 1994).

Marshall, Chris, et al.; "A 2.7V GSM Transceiver ICs with On–Chip Filtering"; *IEEE International Solid–State Circuits Conference*; Paper TA 8.7, pp. 148, 149 and 354 (1995).

Gray, Paul, et al.; *Analysis and Design of Analog Integrated Circuits*; pp. 225–227 (1977).

*Primary Examiner*—Steven J. Mottola
*Attorney, Agent, or Firm*—Marger Johnson & McCollom, P.C.

[57] ABSTRACT

A switched-gain cascode amplifier changes gain by using a differential pair of cascode transistors to switch signal current to one of two different input terminals of a loading network. The load is connected to the loading network which attenuates the output signal by a different amount depending on which input terminal the signal is switched to. In a preferred embodiment, the cascode transistors are driven differentially to conserve power supply headroom, and the bondwire and leadframe inductance of an integrated circuit are utilized as elements of the loading network. The loading network can be extended to include several stages that are implemented as a ladder such as an R/2R ladder with multiple cascode transistors to provide uniform multiple gain steps.

27 Claims, 5 Drawing Sheets

SWITCHED-GAIN CASCODE AMPLIFIER USING LOADING NETWORK FOR GAIN CONTROL

BACKGROUND OF THE INVENTION

1. Field of the Invention

This invention relates generally to cascode amplifiers, and more particularly to a cascode amplifier that controls gain by switching signal current to different nodes in a loading network.

2. Description of the Related Art

Cascode amplifiers are commonly used as low noise amplifiers (LNAs) because they provide high output resistance, good voltage gain, and improved reverse isolation over a single transistor amplifier. FIG. 1 is a schematic diagram of a basic cascode amplifier implemented with bipolar junction transistors (BJTs). The circuit of FIG. 1 includes a first transistor Q1 arranged in a common emitter configuration, and a second transistor Q2 arranged in a common base (also referred to herein as a cascode) configuration. The basic cascode amplifier can also be implemented with metal oxide semiconductor (MOS) transistors, in which case the first transistor is arranged in a common source configuration, and the cascode transistor is arranged in a common gate configuration.

To provide electronic gain control, a second cascode transistor can be used to divert signal current from the first cascode transistor, thereby changing the gain of the amplifier. This technique is sometimes referred to as either a "bypass" technique, because the signal current flowing through the second cascode transistor bypasses the first cascode transistor, or as a "current robbing" technique because the second cascode transistor "steals" signal current from the first.

FIG. 2 is a schematic diagram of a prior art variable-gain cascode amplifier that utilizes the bypass technique. This circuit is described thoroughly in "Introduction to RF Frequency Design," Wes Hayward, 1994, American Radio Relay League, Inc., pp. 249–52, but for convenience, is summarized here.

Referring to FIG. 2, the AC input signal is applied to the base of transistor Q1 through capacitor C1, and the output signal is taken from the collector of transistor Q3 through capacitor C2. FIG. 3 is an equivalent circuit showing the small-signal model of the circuit of FIG. 2. Resistors R3, R4, Re, and R2 establish the DC bias current in Q1. The maximum gain of the amplifier is achieved when Vcontrol is pulled low relative to the bias voltage on the base of Q3. When Q2 is off, all of the current through Q1 (both DC bias current and AC signal current) flows through Q3. The gain at maximum gain is determined by Rc, Re, and the $g_m$ of Q1. Resistors R1 and R2 do not affect the AC gain (except to the extent that R2 determines the bias current, and thus the transconductance and emitter resistance of Q1–Q3) because capacitors C3 and C4 provide AC grounds which effectively eliminate resistors R1 and R2 from the small-signal model as shown in FIG. 3. In other words, resistors R1 and R2 carry DC bias current but not AC signal current.

When Vcontrol is pulled high, Q2 begins to turn on and divert some of the current from Q3, thereby reducing the gain of the amplifier. As the voltage of the control signal Vcontrol keeps increasing, more current from the collector of Q1 is diverted from Q3 to Q2 further reducing the gain.

A disadvantage of the circuit of FIG. 2 is that it is not readily adaptable to providing a fixed gain step between a high gain level and a low gain level. This is because the strong hyperbolic tangent function of the differential pair formed by Q2 and Q3 causes very large changes in output current in response to small changes in Vcontrol. To provide accurate gain switching between two gain levels, Vcontrol would have to be controlled with extreme accuracy. Thus, the circuit of FIG. 2 is inherently difficult to adapt to applications that require a fixed gain step since all signal current is either presented to the output, or shunted to an AC ground via C3.

Another disadvantage of the circuit of FIG. 2 is that if Q2 is driven on to the extent that Q3 switches off, then no drive signal remains at the output (as is apparent from the small signal model of FIG. 3), and the amplifier has essentially no gain at all (except for leakage). Thus, if Q2 and Q3 are operated as a pair of switches (which is realatively easy to accomplish due to the strong nonlinearity of the hyperbolic tangent function), the amplifier only provides a step between a finite gain and no gain, rather than a step between a high gain and a low gain.

FIG. 4 is a schematic diagram of another prior art cascode amplifier with electronic gain control which also uses a type of bypass technique. This circuit was described at the course "RF IC Design for Wireless Communication Systems" by Josef Fenk, Jul. 3–7, 1995, at Ecole Polytechniquie Federale De Lausanne, Lausanne, Switzerland, page 28 of handout.

Referring to FIG. 4, the AC input signal is applied to the base of transistors Q10 and Q11, and the AC output signal is taken from the collector of transistors Q13 and Q14. When the gain control terminal is pulled to ground, all of the AC signal passes through Q13 and Q14 to the output terminal, and the amplifier operates in high gain mode.

When the gain control signal is pulled to VCC, the portion of the AC signal current flowing through Q13 is diverted to the power supply (an AC ground) through Q12, and only that portion of the signal current flowing through Q14 is available at the output terminal. Thus, the amplifier operates in low gain mode when Q12 is on. By choosing the appropriate emitter area ratios between Q12/Q13 and Q10/Q11, one can get accurately controlled gain switching at the output. For example, if Q11 and Q13 have nine times the emitter area of Q10 and Q12, one will get a 10:1 change in current at the RF output. For a given load, this results in a 20 dB gain change.

FIG. 5 is a schematic diagram of an implementation of the cascode amplifier of FIG. 4 in which transistor Q11 is implemented as nine transistors Q11A to Q11I. To preserve accuracy, transistor Q13 is implemented as nine transistors Q13A to Q13I. If the emitter area of all of the transistors are equal, then the signal current available at the output terminal in low gain mode is one-tenth that available in high gain mode.

The circuit of FIG. 4 provides an accurately controlled fixed gain step in response to a digital gain control signal, and thus, is better suited to switched-gain LNA RF applications than the circuit of FIG. 2. However, the circuit of FIG. 4 also has several disadvantages. First, because transistors Q11 and Q13 must be implemented as either a plurality of transistors or with emitter areas that are significantly larger than transistors Q10 and Q12, they take up extra chip area when the circuit is fabricated on an integrated circuit.

A further problem with the circuit of FIG. 4 is that the bypassed signal current is returned to the power supply and is therefore wasted. Also, since the signal current is returned to the power supply, isolation becomes a problem because the signal current can get back to the RF output via the bias circuitry. Although the isolation problem can be alliviated by returning the bypassed signal current to a separate power supply, this requires the use of an additional pin when the circuit is fabricated on an integrated circuit.

A futher problem with the circuit of FIG. 4 is the large parasitic capacitance associated with transistors Q11 and Q13.

Finally, since the ratio of non-diverted signal current in high and low gain mode is determined by the emitter area ratios of the transistors, the gain step is fixed and the user cannot adjust it externally.

Accordingly, a need remains for a switched-gain cascode amplifier that overcomes the disadvantages described above.

SUMMARY OF THE INVENTION

Therefore, it is an object of the present invention to provide a cascode amplifier that provides a gain step in response to a simple gain switch signal.

Another object of the present invention is to provide a cascode amplifier that provides flexibility in determining the gain step to the user.

A further object of the present invention is to provide a cascode amplifier that is simple to implement on an integrated circuit.

To accomplish these and other objects, a switched-gain cascode amplifier constructed in accordance with the present invention changes gain by manipulating a loading network. The amplifier includes a pair of differentially driven cascode transistors that switch signal current to different nodes in the loading network, thereby changing the gain of the amplifier. The load is connected to the loading network which attenuates the output signal by a different amount depending on which input terminal the signal is switched to. In a preferred embodiment, the cascode transistors are driven differentially to increase power supply headroom.

The bondwire and leadframe inductance of an integrated circuit can be utilized as elements of the loading network. The loading network can be extended to include several stages to provide multiple gain steps. If the ladder is implemented as an R/2R ladder (or other suitable attenuation ratio) with multiple cascode transistors, the amplifier can provide uniform gain steps.

One aspect of the present invention is an amplifier comprising: an input stage for generating an intermediate signal responsive to an input signal, the input stage having an output terminal for transmitting the intermediate signal; a loading network for providing an output signal to a load, the loading network having a first input terminal for receiving signal current and a second input terminal for receiving signal current; a first cascode transistor coupled between the first input terminal of the loading network and the output terminal of the input stage for coupling signal current from the input stage to the loading network responsive to a base control signal; and a second cascode transistor coupled between the second input terminal of the loading network and the output terminal of the input stage for coupling signal current from the input stage to the loading network responsive to a gain control signal.

The loading network includes a first resistor coupled between a power supply terminal and the first input terminal, and a second resistor coupled between the first and second input terminals. Alternatively, the loading network can include a first inductor coupled between a power supply terminal and the first input terminal; and a second inductor coupled between the first and second input terminals.

Another aspect of the present invention is an amplifier comprising: an input stage for generating an intermediate signal responsive to an input signal and providing the intermediate signal at an intermediate node; a loading network for providing an output signal to a load, the loading network having a plurality of signal nodes; and a plurality of cascode transistors coupled between the first signal node of the loading network and the intermediate node; wherein the cascode transistors AC couple the intermediate signal from the input stage to the loading network responsive to one or more control signals.

A further aspect of the present invention is a method for controlling the gain of a cascode amplifier comprising a loading network having a first input terminal for receiving signal current, an input stage having an output terminal, and a cascode transistor coupled between the first input terminal of the loading network and the output terminal of the input stage for coupling signal current from the input stage to the loading network, the method comprising: coupling signal current from the output terminal of the input stage to a second input terminal of the loading network responsive to a gain control signal, thereby causing the gain of the amplifier to vary.

An advantage of the present invention is that it is well-suited to providing a fixed-gain step in response to a digital signal. Another advantage is that it provides an integrated circuit designer with great flexibility in optimizing an integrated circuit because the user can be given the ability to adjust both the absolute value of the gain and the gain step. A further advantage is that it saves space on an integrated circuit because it does not require an array of parallel transistors to provide a gain step. Yet another advantage is that a very precise and predictable gain and gain step can be achieved in an amplifier constructed in accordance with the preset invention. The present invention provides these advantages while maintaining relatively small changes in input and output impedance when the gain is changed.

A further advantage of the preset invention is that it can utilize the parasitic package inductance of an integrated circuit as a useful part of the circuit. The present invention also provides a technique for increasing power supply headroom when driving a differential pair of cascode transistors. Yet another advantage of a cascode amplifier according to the present invention is that it can be readily adapted to provide multiple switched gain levels at uniform gain steps. The preset invention also reduces the parasitic capacitance associated with the large transistors required by prior art circuits.

The foregoing and other objects, features and advantages of the invention will become more readily apparent from the following detailed description of a preferred embodiment of the invention which proceeds with reference to the accompanying drawings.

DETAILED DESCRIPTION

Figures 6, 7:
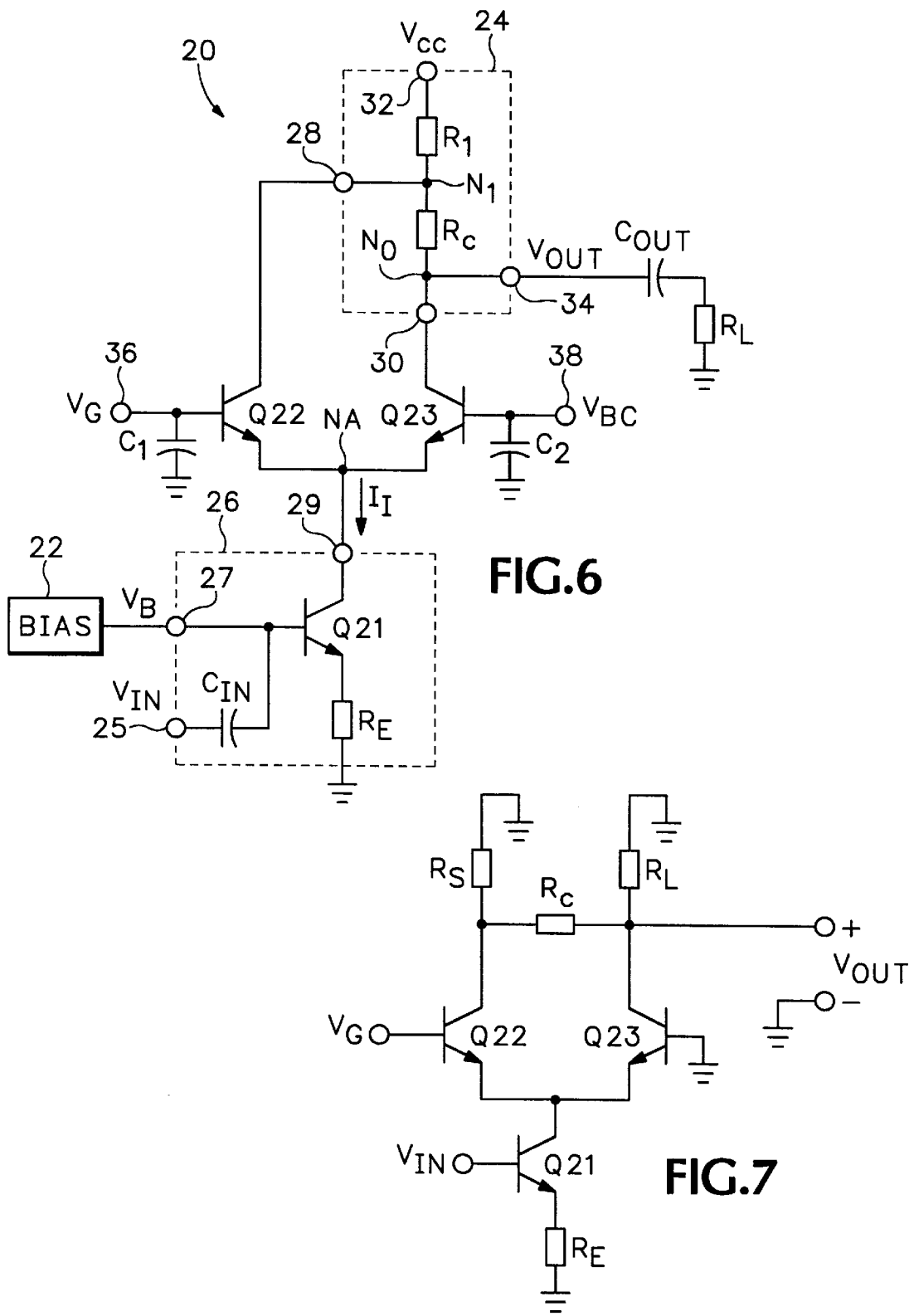
FIG. 6 is a schematic diagram of a first embodiment of a switched-gain cascode amplifier constructed in accordance with the present invention.
FIG. 7 is an equivalent circuit showing the small-signal model of the circuit of FIG. 6.

Indicated generally at 20 in FIG. 6 is a first embodiment of a switched-gain cascode amplifier constructed in accordance with the present invention. The circuit of FIG. 6 includes an input stage 26, a loading network 24, a first cascode transistor Q22, a second cascode transistor 23, and a bias signal generator 22.

The input stage 26 includes an NPN BJT transistor Q21 arranged in a common emitter configuration with its collector connected to the output terminal 29 of the input stage, its emitter coupled to a ground through an emitter resistor RE, and its base connected to a terminal 27 to receive a bias signal $V_{BIAS}$ from bias signal generator 22. The input stage also includes an input capacitor $C_{IN}$ connected between an input terminal 25 for receiving an input signal $V_{IN}$ at the base of Q21.

The loading network 24 has a first input terminal 28 for receiving signal current, a second input terminal 30 for receiving signal current, a power supply terminal 32 for receiving a power supply voltage VCC, and an output terminal 34 for providing an output signal $V_{OUT}$ to a load. The loading network includes a first resistor RS connected between the power supply terminal and a node N1, and a second resistor RC connected between node N1 and a node N0. The first input terminal 28 is connected to node N1, and the second input terminal 30 and the output terminal $V_{OUT}$ are both connected to node N0.

The first cascode transistor Q22 is an NPN BJT arranged in a common base configuration with its emitter connected to the output terminal 29 of the input stage 26 via node NA, its collector connected to the first input terminal 28 of the loading network 24, and its base connected to a gain control terminal 36 to receive the gain control signal VG.

The second cascode transistor Q23 is also an NPN BJT arranged in a common base configuration with its emitter connected to the output terminal 29 of the input stage 26 via node NA, its collector connected to the second input terminal 30 of the loading network 24, and its base connected to a base control terminal 38 to receive the base control signal VBC.

A first decoupling capacitor C1 is connected between the base of Q22 and ground, and a second decoupling capacitor C2 is connected between the base of Q23 and ground.

One terminal of the load RL is coupled to the output terminal 34 of the loading network 24 through an AC coupling capacitor $C_{OUT}$, while the other terminal of the load is connected to ground.

In operation, the input signal $V_{IN}$ is applied to the amplifier 20 of FIG. 6 at the input terminal 25. The input stage converts the input voltage signal to an intermediate current signal at terminal 29. Cascode transistors Q22 and Q23 function as both common base amplifiers and as current switches to couple the intermediate signal to either the first or second input terminals of the loading network. Transistors Q22 and Q23 are controlled by the gain control signal VG and the base control signal VBC, respectively. The output signal $V_{OUT}$ is provided to the load RL at output terminal 34.

When the voltage of the gain control signal VG is low enough compared to the base control signal VBC so that Q23 turns on and Q22 turns off, the amplifier 20 operates in high gain mode because all of the signal current from Q21 flows through Q23 to the second input terminal 30 of the loading network.

To switch to low gain mode, the voltage of the gain control signal VG must be driven high enough compared to the base control signal VBC so that Q23 turns off and Q22 turns on. All of the signal current from Q21 then flows through Q22 to the first input terminal 28 of the loading network which attenuates the output signal relative to the high gain mode.

Figure 1:
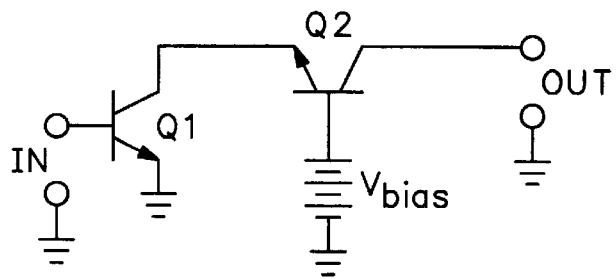
FIG. 1 is schematic diagram of a prior art fixed-gain cascode amplifier.
Figure 2:
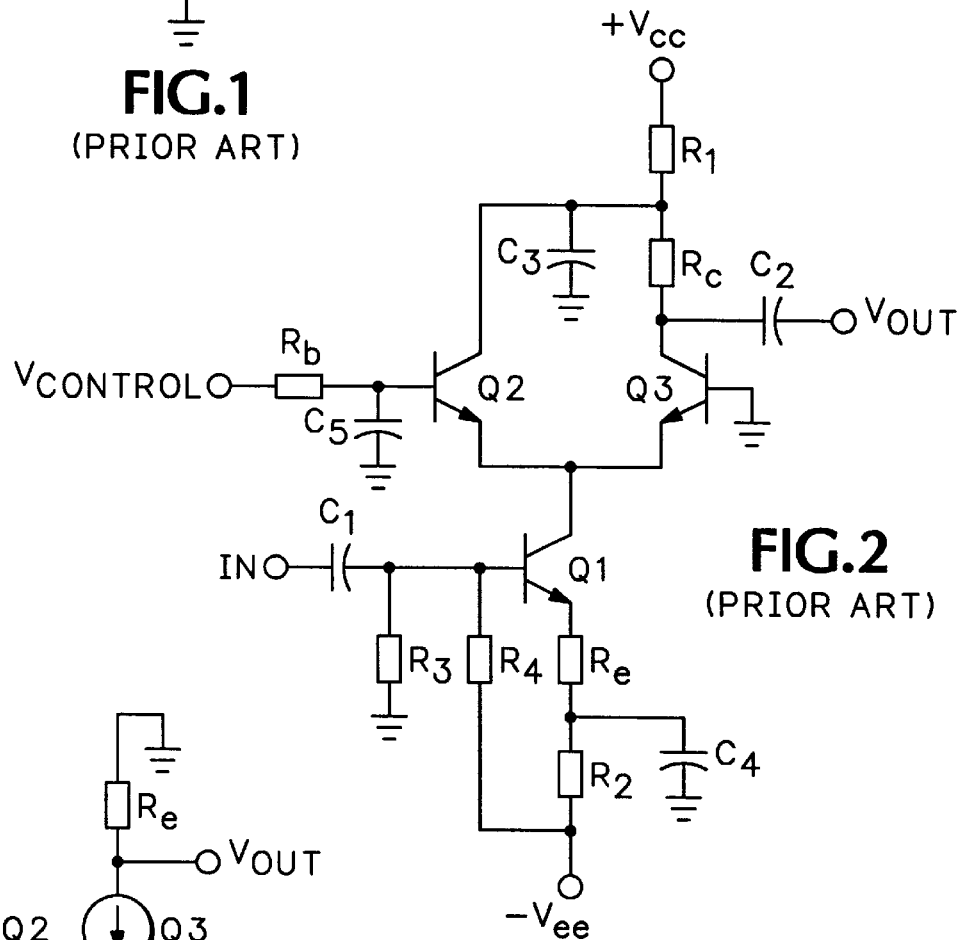
FIG. 2 is a schematic diagram of a prior art variable-gain cascode amplifier.
Figure 4:
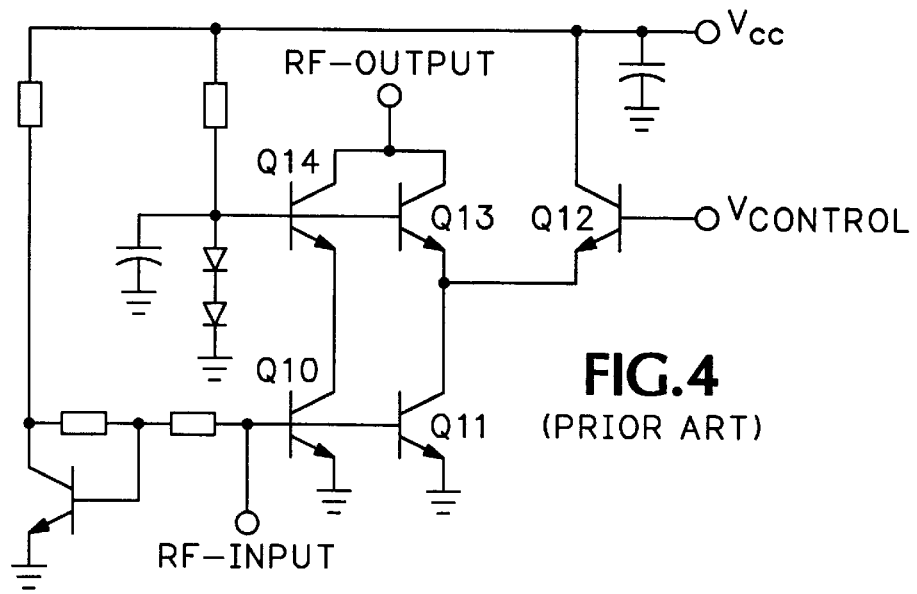
FIG. 4 is a schematic diagram of another prior art cascode amplifier with electronic gain control.
Figure 5:
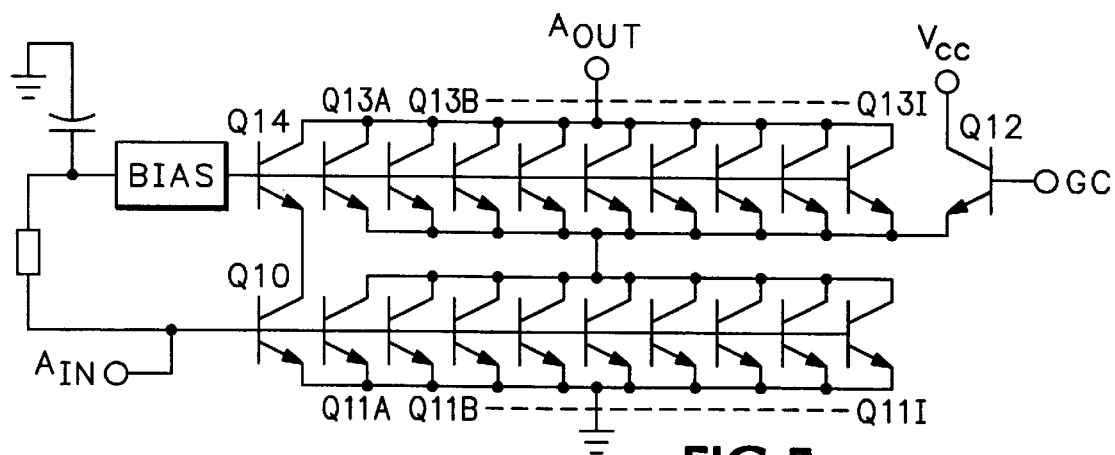
FIG. 5 is a schematic diagram of a practical implementation of the cascode amplifier of FIG. 4.

Thus, the amplifier of FIG. 6 changes gain by using a pair of cascode transistors to switch signal current to different nodes of a loading network, rather than by diverting signal current away from a cascode transistor and to a power supply or AC ground node as in the prior art circuits of FIGS. 2 and 4.

The gain control signal VG and the base control signal VBC are intended to be quasistatic, meaning that after the change from high to low or vice versa, the voltage does not change. The DC bias level of VG and VBC should be set low enough so that for the largest expected output signal swing, the cascode transistors do not saturate.

The cascode transistors Q22 and Q23 can be driven either differentially or single-ended. In single-ended mode, the base control signal VBC at the base of Q23 is maintained at a constant potential, and the voltage of VG is either driven to a voltage that is high enough to turn Q22 on and Q23 off, or it is driven to a voltage that is low enough to turn Q22 off and Q23 on. In differential mode, the voltages of VG and VBC both swing in opposite directions about a center voltage level to turn the two cascode transistors on and off. An advantage of driving Q22 and Q23 differentially is that it conserves power supply headroom by reducing the voltage swing at VG by one-half.

The operation of the amplifier of FIG. 6 will now be described in more detail with reference to FIG. 7 which is an equivalent circuit showing the small-signal model of the circuit of FIG. 6. The circuit model of FIG. 7 assumes that capacitors $C_{IN}$ and $C_{OUT}$ are large enough to effectively be short circuits at the frequency of operation and that capacitors C1 and C2 generate effective AC grounds at the bases of Q22 and Q23.

In the circuit of FIG. 7, the base of Q21 receives the input signal $V_{IN}$, and the emitter of Q21 is coupled to ground through RE. The emitters of Q22 and Q23 are connected to the collector of Q21. The base of Q22 receives the gain control signal VG, and the base of Q23 is effectively grounded. Resistor RC is connected between the collectors of Q22 and Q23. Resistor RS is connected between the collector of Q22 and VCC, an AC ground, and the load RL is connected between the collector of Q23 and ground. The output signal $V_{OUT}$ is measured from the collector of Q23 to ground.

From FIG. 7, the following equations are obtained for the gain of the amplifier in high gain mode (GainHI) and low gain mode (GainLO):

$$\text{GainHI} = V_{OUT}/V_{IN} = (RL \| (RS+RC))/RE \quad \text{(Eq. 1)}$$

$$\text{GainLO} = \{(RS\|(RL+RC))/RE\} \cdot \{RL/(RL+RC)\} \quad \text{(Eq. 2)}$$

where the symbol "||" indicates a parallel combination of components. For purposes of these equations, RE is assumed to be much larger than the $r_e$ of Q21. From this it can be seen that amplification is achieved by the whole circuit of FIG. 6. The input stage 26 converts an input voltage signal $V_{IN}$ into the intermediate current signal $I_1$ which then flows through one of the cascode transistors and gets applied to the load. The value of the load relative to RE, RS, and RC determines the gain or amplification factor.

If the load is buffered from the loading network, the term RL is eliminated from Equations 1 and 2 which simplify as follows:

$$\text{GainHI} = V_{OUT}/V_{IN} = (RS + RC)/RE \quad \text{(Eq. 1)}$$

$$\text{GainLO} = RS/RE \quad \text{(Eq. 2)}$$

If capacitor $C_{OUT}$ is relatively small at the frequency of operation, it becomes part of the load, and the gain equations change accordingly. For a complete gain equation, all parasitics need to be considered as well.

An advantage of the amplifier circuit of FIG. 6 is that it is well-suited to providing a fixed-gain step because the signals VG and VBC are essentially digital rather than analog signals. Another advantage is that it provides an integrated circuit (IC) designer with great flexibility in optimizing an IC that includes this amplifier circuit. For example, if RS and RC are implemented as external components, the user is given the ability to adjust both the absolute value of the gain and the gain step by selecting the values of RS and RC. On the other hand, if RC is implemented on the chip, one less pin is required for the amplifier. A further advantage is that it saves space on an integrated circuit because it does not require an array of parallel transistors or large, highly ratioed emitter areas to provide a gain step. Therefore, it also eliminates the high parasitic capacitance associated with large or multiple transistors. Yet another advantage is that a very precise and predictable gain and gain step can be achieved if the resistors RS and RC are implemented on an IC chip as unit resistors because the resistors can be matched very accurately. The circuit of FIG. 6 provides these advantages while maintaining relatively small change in input and output impedance when the gain is changed.

Figure 8:
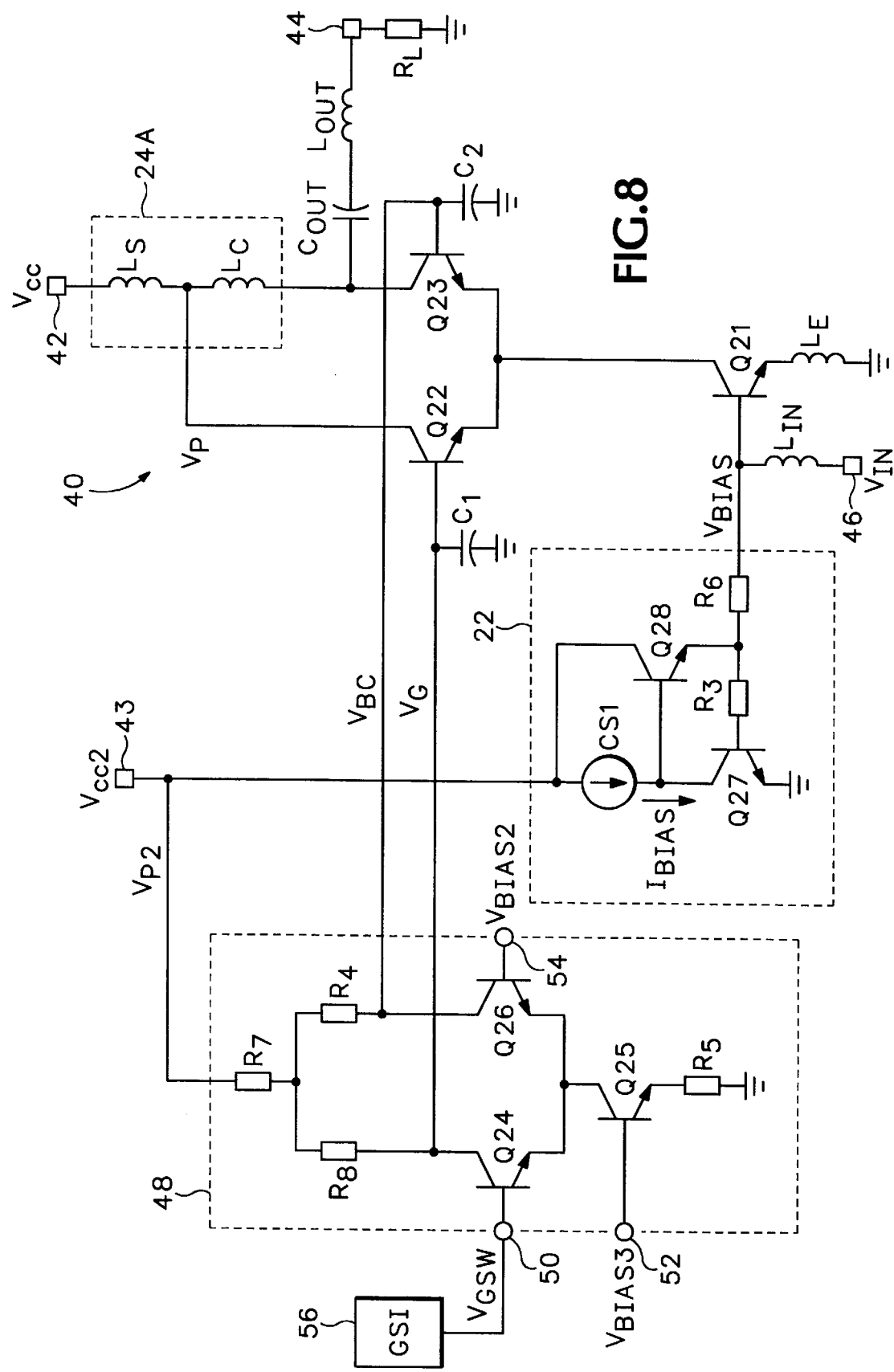
FIG. 8 is a simplified schematic diagram of a second embodiment of a cascode amplifier constructed in accordance with the present invention.

A further advantage of the circuit of FIG. 6 is that it is readily adaptable to utilizing the parasitic package inductance of an integrated circuit (which is otherwise considered undesirable) as a useful part of the loading network in an inductively loaded embodiment of the present invention. One such embodiment is shown in FIG. 8 which is a simplified schematic diagram of a second embodiment of a cascode amplifier in accordance with the present invention. The amplifier circuit 40 of FIG. 8 is intended for implementation as an LNA on an RF integrated circuit.

Amplifier 40 is similar to the amplifier 20 of FIG. 6, but loading network 24A utilizes inductors LS and LC in place of resistors RS and RC, respectively, and RE is replaced by LE to achieve lower noise and lower power supply voltage operation. Components in FIG. 8 which correspond to components in FIG. 6 are shown with the same reference designators as those in FIG. 6. For simplicity, implementation details such as metal parasitics, substrate resistance modeling, and use of multiple fused pins and the like are not shown.

Referring to FIG. 8, inductor LS is the inductance of the leadframe and bondwire leading to the VCC pin 42 of the IC package. Inductor LC is a spiral inductor fabricated on the IC chip. Inductor $L_{OUT}$ is the inductance of the leadframe and bondwire leading to the output pin 44, while $L_{IN}$ is the inductance of the leadframe and bondwire leading to the input pin 46.

A separate power supply VCC2 is provided through a second power supply pin 43 to a node VP2 for supplying the various other subcircuits shown in FIG. 8. The use of a second power supply provides isolation between the signal and the bias circuitry.

A differential signal generator for driving the bases of Q22 and Q23 is shown at 48. The generator 48 includes a differential pair of transistors Q24 and Q26 which convert a single ended gain switch signal VGSW, which is received at terminal 50, to the pair of differential signals VG and VBC. The gain switch signal VGSW is generated by the gain switch interface (GSI) 56 which drives VGSW with voltage swing centered around $V_{BIAS2}$ in response to a digital CMOS input signal. Any suitable bias circuits can be used to generate the bias signal $V_{BIAS2}$ at terminal 54 and the bias signal $V_{BIAS3}$ at terminal 52 for setting the collector current through Q25 and biasing up the differential pair Q24 and Q26. Also, the gain switch interface 56 can be implemented with any suitable circuitry.

Also shown in FIG. 8 are details of a simple bias signal generator 22 suitable for biasing transistor Q21 in the input stage. The bias signal generator 22 includes current source CS1 that is connected between the node VP2 and the collector of an NPN transistor Q27. The emitter of Q27 is connected to ground, and the base of Q27 is connected to the first terminal of a resistor R3. The second terminal of R3 is connected to the first terminal of a resistor R6 which has its other terminal connected to the base of Q21 for providing the bias signal $V_{BIAS}$ thereto. Bias signal generator 22 also includes another NPN transistor Q28 which has a collector connected to the node VP2, an emitter connected to the second terminal of R3, and a base connected to the collector of Q27.

Current source CS1 sets a bias current $I_{BIAS}$ which is mirrored by a current mirror formed by Q27 and Q21. The relative emitter areas of Q27 and Q21, together with R3 and R6, are adjusted to obtain a suitable bias current in Q21. Transistor Q28 improves the gain and accuracy of the current mirror. Resistors R3 and R6 are necessary to isolate the RF input signal from the bias network. Ideally, R3 and R6 should be as large as possible to provide better isolation, but the maximum value is limited by the desire to keep the current ratio defined mostly by the area ratios of Q27 and Q28, rather than by the base currents whose value depends on the uncertainty of the beta of the devices. In addition, there are possible headroom constraints on current source CS1. If the voltage drop across R3 and R6 are equal, translinearity of the base-emitter loop is preserved.

It should be noted that parallel resonant circuits can be used instead of inductors in the circuit of FIG. 8. Resonant circuits provide the advantage of tuning the output load and maximizing the gain at resonance. When resistors are used for the loading network, the high and low gain of the amplifier are essentially constant over a broad bandwidth, but when reactive components are used, the gain will be frequency dependent.

Yet another advantage of a cascode amplifier according to the present invention is that it can be readily adapted to provide multiple switched gain levels. This advantage is demonstrated in FIG. 9 which is a simplified schematic diagram of a third embodiment of a cascode amplifier constructed in accordance with the present invention. In the amplifier circuit of FIG. 9, one or more additional cascode transistors are added and the loading network is extended to form a ladder.

Figure 9:
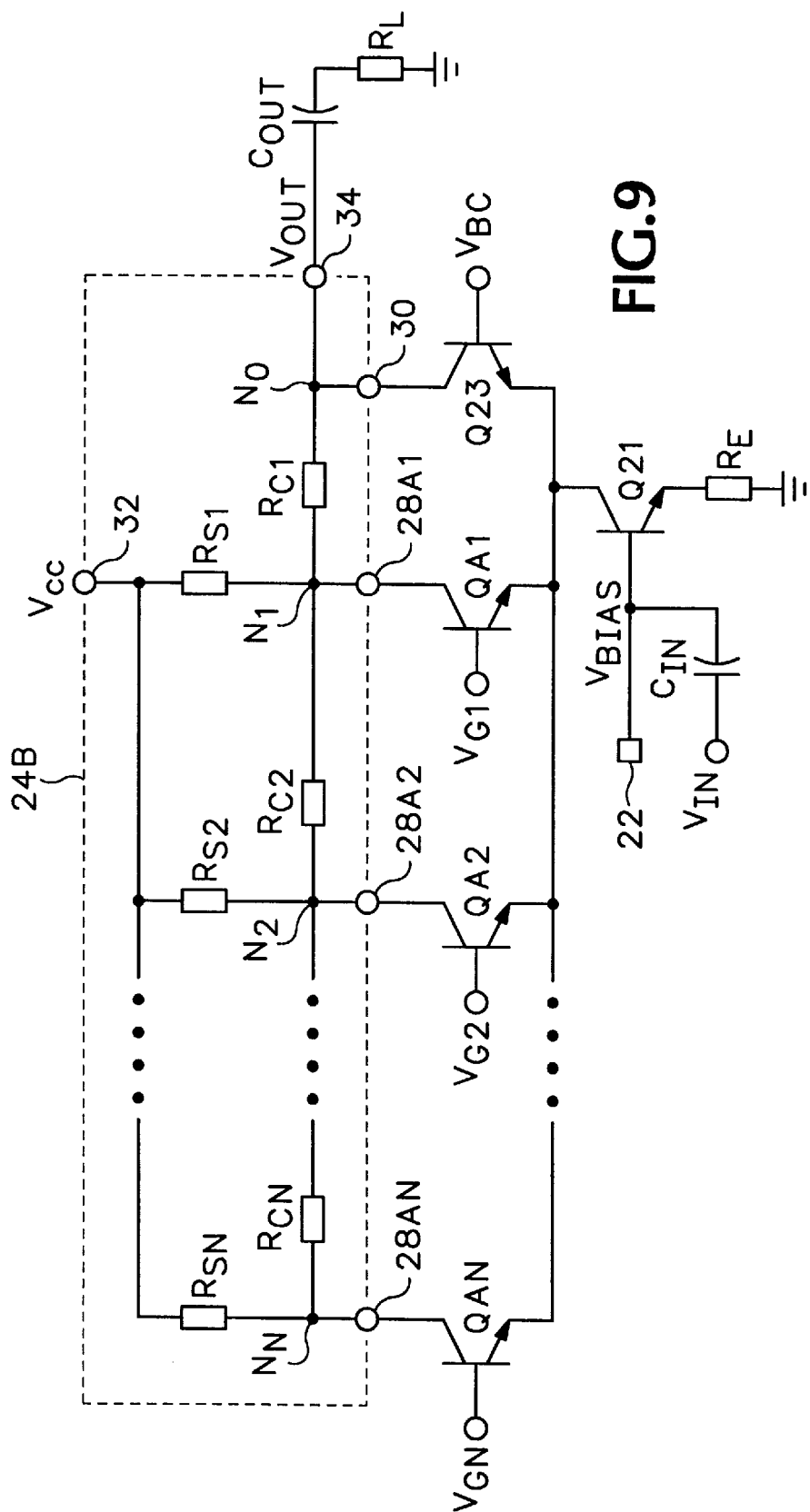
FIG. 9 is a simplified schematic diagram of a third embodiment of a cascode amplifier constructed in accordance with the present invention.

The circuit components of FIG. 9 which correspond to components in FIG. 6 have the same reference designators as those in FIG. 6. However, transistor Q22 and resistors RS and RC have been redesignated QA1, RS1 and RC1, respectively. The gain control signal VG is also redesignated VG1.

The loading network 24B of FIG. 9 further includes a third resistor RC2 which is connected between node N1 and a node N2. A fourth resistor RS2 is connected between node N2 and the power supply terminal 32. A third input terminal 28A2 for receiving signal current is connected to node N2. The circuit of FIG. 9 further includes a third NPN cascode transistor QA2 having a collector connected to the third input terminal, an emitter connected to the output terminal 29 of the input stage, and a base coupled to receive a second gain control signal VG2.

The loading network 24B can also include additional stages with each stage including two additional resistors up to RCN and RSN as shown in FIG. 9. Each stage must be accompanied by an additional cascode transistor up to QAN, each of which switches in response to an additional gain control signal up to VGN.

The third cascode transistor QA2, as well as any additional cascode transistors up to QAN, couple signal current from the input stage to the loading network responsive to the second and subsequent gain control signals VG2 . . . VGN. This provides tremendous flexibility in selecting gain steps by selecting values for resistors RC1 . . . RCN and RS1 . . . RSN, and by switching one or more of QA1 . . . QAN on at a time.

Also, the use of additional cascode transistors allows a further degree of freedom in selecting gain steps because the emitter area ratios between Q23, QA1 . . . QAN can be adjusted. However, the use of equal emitter areas simplifies the analysis of the circuit.

A particularly useful combination of component values is obtained when the loading network 24B is implemented as an R/2R ladder using unit resistors. In other words, if RL has a resistance of R, where R is a predetermined unit of resistance, RC1 . . . RCN are also implemented with a resistance of R, while RS1 . . . RSN-1 are implemented with a resistance of 2R. RSN (the last RS in the ladder) is implemented with a resistance of R. Then, by only switching on one of the cascode transistors at a time, the gain can be made to change in uniform steps. For example, if the gain is defined as 0 dB when only Q23 is on, then the gain decreases by 6 dB if only QA1 is on, the gain decreases by an additional 6 dB if only QA2 is turned on, etc.

The expanded loading network can also be implemented with inductors as well as resistors to achieve lower noise and power supply voltage operation, or other resistive and reactive components to form a generalized Z/nZ impedance ladder where n can be any number, integer or fraction. Then, Z can be any suitable passive device such as, for example, an inductor, in which case the ladder would be an L/nL ladder.

It should also be noted that the circuits described above can also be implemented with transistors other than NPN BJT, for example PNP BJTs or MOS transistors.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. An amplifier comprising:
   an input stage for generating an intermediate signal responsive to an input signal, the input stage having an output terminal for transmitting the intermediate signal;
   a loading network for providing an output signal to a load, the loading network having first terminal for receiving signal current and a second input terminal for receiving signal current;
   a first cascode transistor coupled between the first input terminal of the loading network and the output terminal of the input stage for coupling signal current from the input stage to the loading network responsive to a base control signal; and
   a second cascode transistor coupled between the second input terminal of the loading network and the output terminal of the input stage for coupling signal current from the input stage to the loading network responsive to a gain control signal;
   wherein the first cascode transistor is connected directly to the first input terminal of the loading network, and the second cascode transistor is connected directly to the second input terminal of the loading network.

2. An amplifier according to claim 1 wherein the loading network includes:
   first resistor coupled between a power supply terminal and the first input terminal; and
   a second resistor coupled between the first and second input terminals.

3. An amplifier comprising:
   an input stage for generating an intermediate signal responsive to an input signal, the input stage having an output terminal for transmitting the intermediate signal;
   a loading network for providing an output signal to a load, the loading network having a first input terminal for receiving signal current and a second input terminal for receiving signal current;
   a first cascode transistor coupled between the first input terminal of the loading network and the output terminal of the input stage for coupling signal current from the input stage to the loading network responsive to a base control signal; and
   a second cascode transistor coupled between the second input terminal of the loading network and the output terminal of the input stage for coupling signal current from the input stage to the loading network responsive to a gain control signal;
   wherein the loading network includes:
   a first inductor coupled between a power supply terminal and the first input terminal; and
   a second inductor coupled between the first and second input terminals.

4. An amplifier comprising:
   an input stage for generating an intermediate signal responsive to an input signal, the input stage having an output terminal for transmitting the intermediate signal;
   a loading network for providing an output signal to a load, the loading network having a first input terminal for receiving signal current and a second input terminal for receiving signal current;
   a first cascode transistor coupled between the first input terminal of the loading network and the output terminal of the input stage for coupling signal current from the input stage to the loading network responsive to a base control signal; and
   a second cascode transistor coupled between the second input terminal of the loading network and the output terminal of the input stage for coupling signal current from the input stage to the loading network responsive to a gain control signal;

wherein the loading network includes:
a first inductor coupled between a power supply terminal and the first input terminal; and
a second inductor coupled between the first and second input terminals; and wherein:
the amplifier is fabricated on an integrated circuit; and
the first inductor is a component of the integrated circuit having a parasitic impedance.

5. An amplifier according to claim 4 wherein the component of the integrated circuit having a parasitic impedance is a bondwire.

6. An amplifier according to claim 4 wherein the component of the integrated circuit having a parasitic impedance is a leadframe.

7. An amplifier comprising:
an input stage for generating an intermediate signal responsive to an input signal, the input stage having an output terminal for transmitting the intermediate signal;
a loading network for providing an output signal to a load, the loading network having a first input terminal for receiving signal current and a second input terminal for receiving signal current;
a first cascode transistor coupled between the first input terminal of the loading network and the output terminal of the input stage for coupling signal current from the input stage to the loading network responsive to a base control signal;
a second cascode transistor coupled between the second input terminal of the loading network and the output terminal of the input stage for coupling signal current from the input stage to the loading network responsive to a gain control signal; and
a differential signal generator coupled to the first and second cascode transistors to generate the gain control signal and the base control signal responsive to a gain switch signal.

8. An amplifier according to claim 1 wherein:
the input stage includes a first transistor having a first terminal coupled to receive an input signal, a second terminal coupled to receive a first power supply signal, and a third terminal;
the first cascode transistor has a first terminal coupled to the third terminal of the first transistor, a second terminal coupled to the first input terminal of the loading network, and a third terminal coupled to receive the base control signal; and
the second cascode transistor has a first terminal coupled to the third terminal of the first transistor, a second terminal coupled to the second input terminal of the loading network, and a third terminal coupled to receive the gain control signal.

9. An amplifier comprising:
an input stage for generating an intermediate signal responsive to an input signal, the input stage having an output terminal for transmitting the intermediate signal;
a loading network for providing an output signal to a load, the loading network having a first input terminal for receiving signal Current, a second input terminal for receiving signal current, and a third input terminal for receiving signal current;
a first cascode transistor coupled between the first input terminal of the loading network and the output terminal of the input stage for coupling signal current from the input stage to the loading network responsive to a base control signal;

a second cascode transistor coupled between the second input terminal of the loading network and the output terminal of the input stage for coupling signal current from the input stage to the loading network responsive to a gain control signal; and
a third cascode transistor coupled between the third input terminal of the loading network and the output terminal of the input stage for coupling signal current from the input stage to the loading network responsive to a second gain control signal.

10. An amplifier according to claim 9 wherein the loading network includes:
a first passive component coupled between a power supply terminal and the first input terminal;
a second passive component coupled between the first and second input terminals;
a third passive component coupled between the power supply terminal and the third input terminal; and
a fourth passive component coupled between the second and third input terminals.

11. An amplifier according to claim 10 wherein:
the load, the second, third, and fourth passive components have about equal impedances; and
the first passive component has about twice the impedance of the load.

12. An amplifier according to claim 10 wherein:
the amplifier is fabricated on an integrated circuit; and
at least one of the passive components is a component of the integrated circuit having a parasitic impedance.

13. An amplifier comprising:
an input stage for generating an intermediate signal at an intermediate node responsive to an input signal;
a loading network for providing an output signal to a load, the loading network having a plurality of signal nodes; and
a plurality of cascode transistors, each transistor coupled between one of the signal nodes of the loading network and the intermediate node;
wherein the plurality of cascode transistors couple signal current from the input stage to the loading network responsive to one or more control signals; and
wherein each of the cascode transistors is connected directly to a corresponding one of the signal nodes of the loading network.

14. An amplifier comprising:
an input stage for generating an intermediate signal at an intermediate node responsive to an input signal;
a loading network for providing an output signal to a load, the loading network having a plurality of signal nodes; and
a plurality of cascode transistors, each transistor coupled between one of the signal nodes of the loading network and the intermediate node;
wherein the plurality of cascode transistors couple signal current from the input stage to the loading network responsive to one or more control signals; and
wherein the loading network includes an impedance ladder.

15. An amplifier according to claim 14 wherein the impedance ladder is a Z/nZ ladder.

16. An amplifier according to claim 15 wherein the Z/nZ ladder is an R/2R ladder.

17. An amplifier according to claim 15 wherein the Z/nZ ladder is an L/nL ladder.

18. A variable gain cascode amplifier comprising:

means for generating an intermediate AC signal responsive to an input signal;

loading means having a first node and a second node;

first cascode means for coupling the intermediate AC signal to the first node of the loading means; and second cascode means for coupling the intermediate AC signal to the second node of the loading network responsive to a gain control signal;

wherein the first cascode means is connected directly to the first node of the loading means.

19. A method for controlling the gain of a cascode amplifier comprising a loading network having a first input terminal for receiving signal current, an input stage having an output terminal, and a cascode transistor coupled between the first input terminal of the loading network and the output terminal of the input stage for coupling signal current from the input stage to the loading network, the method comprising:

coupling signal current from the output terminal of the input stage to a second input terminal of the loading network responsive to a first gain control signal; and coupling signal current from the output terminal of the input stage to a third input terminal of the loading network responsive to a second gain control signal.

20. A method for controlling the gain of a cascode amplifier comprising a loading network having a first input terminal for receiving signal current, an input stage having an output terminal, and a cascode transistor coupled between the first input terminal of the loading network and the output terminal of the input stage for coupling signal current from the input stage to the loading network, the method comprising:

coupling signal current from the output terminal of the input stage to a second input terminal of the loading network responsive to a gain control signal, thereby causing the gain of the amplifier to vary;

wherein coupling signal current from the output terminal of the input stage to a second input terminal of the loading network responsive to a gain control signal includes:

turning on a second cascode transistor coupled between the second input terminal of the loading network and the output terminal of the input stage; and turning off the first cascode transistor.

21. A method for controlling the gain of a cascode amplifier comprising a loading network having a first input terminal for receiving signal current, an input stage having an output terminal, and a cascode transistor coupled between the first input terminal of the loading network and the output terminal of the input stage for coupling signal current from the input stage to the loading network, the method comprising:

coupling signal current from the output terminal of the input stage to a second input terminal of the loading network responsive to a gain control signal, thereby causing the gain of the amplifier to vary; and coupling signal current from the output terminal of the input stage to a third input terminal of the loading network responsive to a second gain control signal.

22. A method according to claim 20 further including driving the first and second cascode transistors differentially, thereby conserving power supply headroom.

23. An amplifier comprising:

an input stage for generating an intermediate signal responsive to an input signal, the input stage having an output terminal for transmitting the intermediate signal;

a loading network for providing an output signal to a load, the loading network having a first input terminal for receiving signal current and a second input terminal for receiving signal current;

a first cascode transistor coupled between the first input terminal of the loading network and the output terminal of the input stage for coupling signal current from the input stage to the loading network responsive to a base control signal; and a second cascode transistor coupled between the second input terminal of the loading network and the output terminal of the input stage for coupling signal current from the input stage to the loading network responsive to a gain control signal;

wherein the loading network includes:

a first parallel resonant circuit coupled between a power supply terminal and the first input terminal; and a second parallel resonant circuit coupled between the first and second input terminals.

24. An amplifier according to claim 7 wherein the differential signal generator is constructed to generate the gain control signal and the base control signal such that only one of the cascode transistors is turned on at a time.

25. An amplifier according to claim 9 wherein at least one of the cascode transistors has a different emitter area than the other cascode transistors.

26. A method according to claim 19 wherein:

coupling signal current from the output terminal of the input stage to a second input terminal of the loading network responsive to a first gain control signal includes controlling a second cascode transistor coupled between the second input terminal of the loading network and the output terminal of the input stage responsive to the first gain control signal; and coupling signal current from the output terminal of the input stage to a third input terminal of the loading network responsive to a second gain control signal includes controlling a third cascode transistor coupled between the third input terminal of the loading network and the output terminal of the input stage responsive to the second gain control signal.

27. A method according to claim 26 further including turning on only one of the first, second and third cascode transistors at a time.

* * * * *

UNITED STATES PATENT AND TRADEMARK OFFICE
CERTIFICATE OF CORRECTION

PATENT NO.   : 6,046,640
DATED        : April 4, 2000
INVENTOR(S)  : Brunner

It is certified that error appears in the above-identified patent and that said Letters Patent is hereby corrected as shown below:

Title page,
Illustrative figure, "$R_1$," should read -- $R_s$ --.

Figure 3:
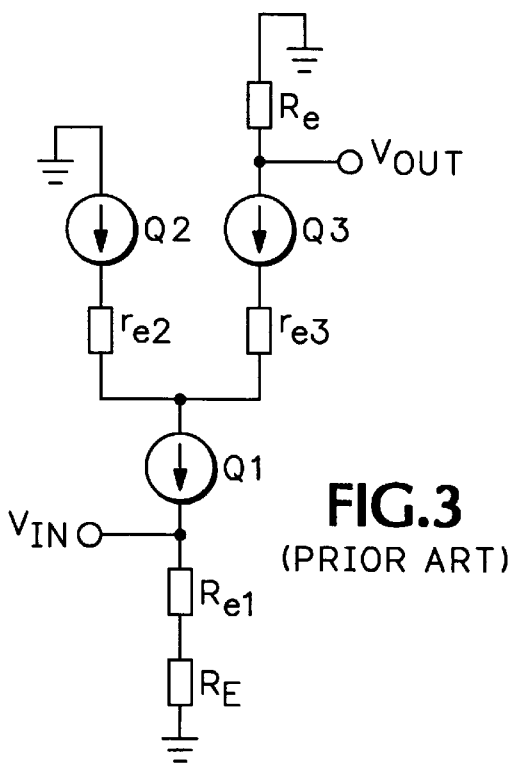
FIG. 3 is an equivalent circuit showing the small-signal model of the circuit of FIG. 2.

Drawings,
FIG. 3, "$R_{e1}$" should read -- $r_{e1}$ --;
FIG. 6, "$R_1$" should read -- $R_s$ --;

Column 2,
Line 25, "Jul." should read -- July --;

Column 3,
Line 1, "alliviated" should read -- alleviated --;

Column 4,
Lines 35, 38, and 47, "preset" should read -- present --;
Line 58, insert -- a -- between "is" and "schematic";

Column 7,
Line 6, "$I_1$" should read -- $I_I$ --;

Column 10,
Line 2, insert -- a -- between "having" and "first";
Line 2, insert -- input -- between "having" and "terminal";

Column 11,
Line 60, "Current" should read -- current --.

Signed and Sealed this

Thirtieth Day of July, 2002

Attest:

JAMES E. ROGAN
*Attesting Officer*        *Director of the United States Patent and Trademark Office*